(12) United States Patent
Hargan

(10) Patent No.: US 11,557,368 B1
(45) Date of Patent: Jan. 17, 2023

(54) SYSTEM AND METHOD TO MINIMIZE CODEWORD FAILURE RATE

(71) Applicant: Micron Technology, Inc., Boise, ID (US)

(72) Inventor: Mohammed Ebrahim H. Hargan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/370,564

(22) Filed: Jul. 8, 2021

(51) Int. Cl.
| G11C 29/12 | (2006.01) |
| G11C 29/44 | (2006.01) |
| G11C 29/42 | (2006.01) |
| G11C 29/18 | (2006.01) |

(52) U.S. Cl.
CPC ...... *G11C 29/4401* (2013.01); *G11C 29/1201* (2013.01); *G11C 29/18* (2013.01); *G11C 29/42* (2013.01); *G11C 2029/1202* (2013.01); *G11C 2029/1204* (2013.01)

(58) Field of Classification Search
CPC . G11C 29/4401; G11C 29/1201; G11C 29/18; G11C 29/42; G11C 2029/1202; G11C 2029/1204
See application file for complete search history.

(56) References Cited

U.S. PATENT DOCUMENTS

| 2009/0204824 A1* | 8/2009 | Lin ..................... G06F 12/0246 714/E11.041 |
| 2015/0067248 A1* | 3/2015 | Yoo ........................ G11C 29/78 711/105 |
| 2018/0374541 A1* | 12/2018 | Jung ...................... G11C 16/20 |
| 2019/0108889 A1* | 4/2019 | Gholamipour ...... G06F 12/0623 |
| 2021/0311868 A1* | 10/2021 | Chen ..................... H04L 9/0869 |

OTHER PUBLICATIONS

U.S. Appl. No. 16/903,921, filed Jun. 17, 2020, John Christopher Sancon.
U.S. Appl. No. 17/008,254, filed Aug. 31, 2020, Hari Giduturi.

* cited by examiner

*Primary Examiner* — Mohammed A Bashar
(74) *Attorney, Agent, or Firm* — Fletcher Yoder, P.C.

(57) ABSTRACT

Memory devices may have an array of elements in two or more dimensions. The memory devices use multiple access lines arranged in a grid to access the memory devices. Memory cells located at intersections of the access lines in the grid. Drivers are used for each access line and configured to transmit a corresponding signal to respective memory cells of the plurality of memory cells via a corresponding access line. The memory devices may use an address scrambler to determine a bit error rate for accessing memory cells and remap an address of a particular memory cell to have a bit error rate below a threshold. In this way, the address scrambler may distribute the bit error rates of multiple accesses of the array.

20 Claims, 7 Drawing Sheets

SYSTEM AND METHOD TO MINIMIZE CODEWORD FAILURE RATE

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Generally, a computing system includes processing circuitry, such as one or more processors or other suitable components, and memory devices, such as chips or integrated circuits. One or more memory devices may be used on a memory module, such as a dual in-line memory module (DIMM), to store data accessible to the processing circuitry. For example, based on a user input to the computing system, the processing circuitry may request that a memory module retrieve data corresponding to the user input from its memory devices. In some instances, the retrieved data may include firmware, or instructions executable by the processing circuitry to perform an operation and/or may include data to be used as an input for the operation. In addition, in some cases, data output from the operation may be stored in memory, such as to enable subsequent retrieval of the data from the memory.

Some of the memory devices include memory cells that may be accessed by turning on a transistor that couples the memory cell (e.g., a capacitor) with a wordline or a bitline. In contrast, threshold-type memory devices include memory devices that are accessed by providing a voltage across a memory cell, where the data value is stored based on the threshold voltage of the memory cell. For example, the data value may be based on whether the threshold voltage of the memory cell is exceeded and, in response to the voltage provided across the memory cell, the memory cell conducts current. The data value stored may be changed, such as by applying a voltage sufficient to change the threshold voltage of the memory cell. One example of a threshold-type memory cell may be a cross-point memory cell.

With threshold-type memories, wordlines and bitlines are used to transmit selection signals to respective memory cells. The selection signals may include signals characterized by voltage levels used to save data into or retrieve data from the memory cells. The wordlines and bitlines may couple to selection signal sources through drivers. The memory cells may be organized into one or more layers of memory cells, such as layers defined between overlapping wordlines and bitlines. These layers may be referred to as decks (e.g., memory decks). Various combinations of the wordlines, bitlines, and/or decoders may be referenced for use in a particular memory operation using addresses (e.g., memory addresses). The address may indicate which memory cell is to be selected using a combination of signals from the wordlines, bitlines, and/or decoders, and a particular value of the address may be based on ranges of addresses of the memory device. As may be appreciated, some memory cells at some intersections of the wordlines and bitlines may be farther from drivers than other memory cells at other intersections. Due to the different electrical properties of paths between the different intersections and drivers, the memory cells may react differently. For instance, near memory cells to the drivers may wear more quickly than far memory cells.

BRIEF DESCRIPTION OF THE DRAWINGS

Various aspects of this disclosure may better be understood upon reading the following detailed description and upon reference to the drawings described below.

DETAILED DESCRIPTION

Figure 1:
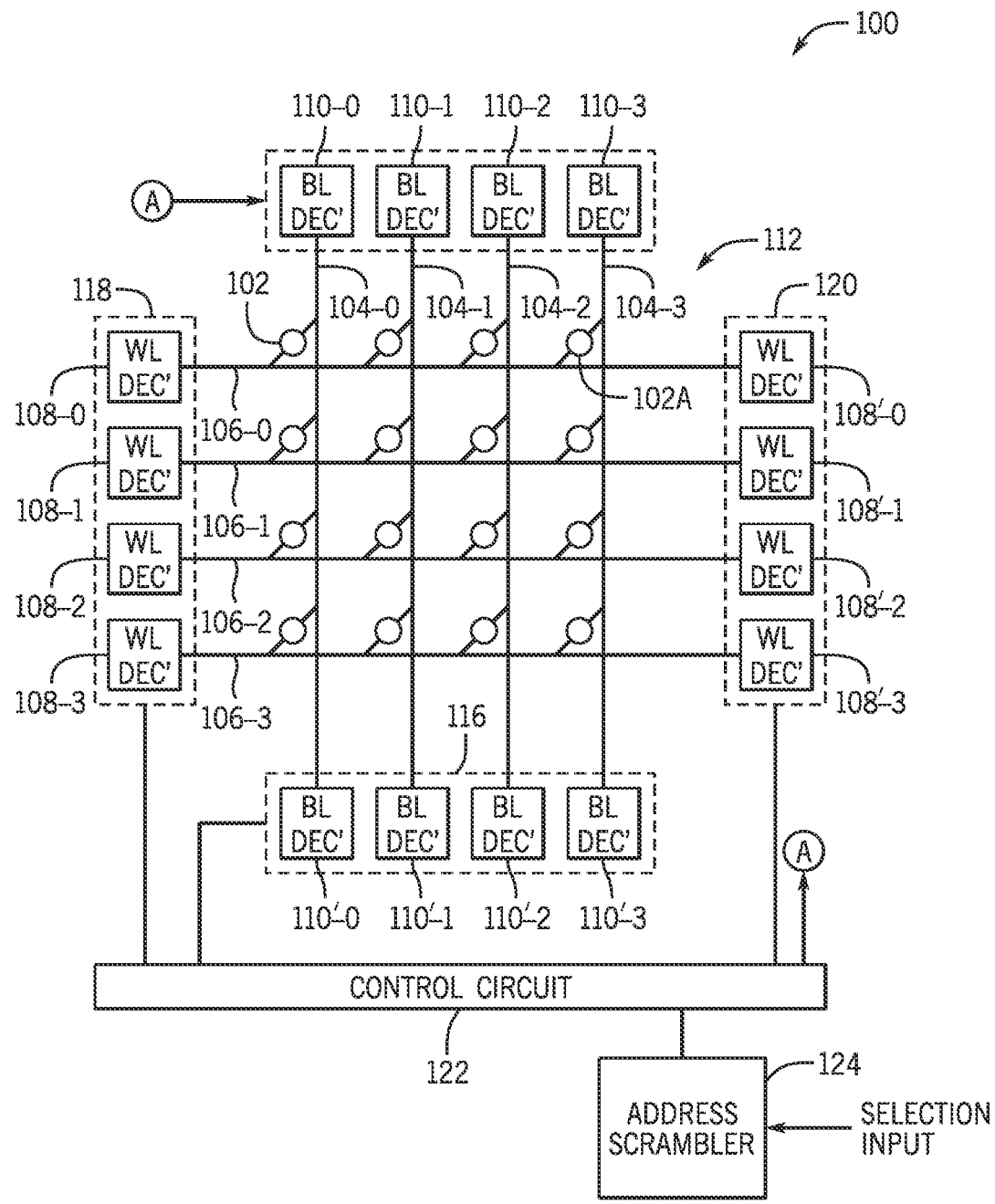
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memories generally include an array of memory cells, where each memory cell is coupled between at least two access lines. For example, a memory cell may be coupled to access lines, such as a bitline and a wordline. Each access line may be coupled to a large number of memory cells. To select a memory cell, one or more drivers may provide selection signals (e.g., a voltage and/or a current) on the access lines to access storage capacities of the memory cell. By applying voltages and/or currents to the respective access lines, the memory cell may be accessed, such as to write data to the memory cell and/or read data from the memory cell.

In some memories, memory cells of the array may be organized into decks of memory cells. A deck of memory cells may be a single plane of memory cells disposed between a layer of wordlines and a layer of bitlines. The array may be a stack of decks that includes any number of decks of memory cells (e.g., 0 decks, 1 deck, 2 decks, 4 decks, any number of decks) as different layers of the array.

Within a deck, a two-dimensional array of memory cells may be arranged at different intersections of the wordlines and the bitlines in the plane. Some of the intersections may be relatively close to the wordline drivers and/or the bitline drivers while others of the intersections may be relatively far from the wordline drivers and/or the bitline drivers. The transmission lines between the drivers and the intersections may differ. For example, the differences may be related to length of the transmission lines and/or parasitic capacitances and/or resistances in the transmission lines. These different lengths and electrical parameters are referred to herein as an electrical distance (ED). The ED of each memory cell may be based on a distance from a wordline driver and/or a bitline driver used to drive the memory cell. Due to the difference in transmission lines between the close intersections and the far intersections, the different intersections may receive voltage and/or current transmissions from the drivers at different levels and/or with different waveshapes. These differences in voltage/current or waveshapes at the different intersections may cause the close memory cells to undergo more stress with rapid current/voltage changes to which the far memory cells may not be subject. Accordingly, the close memory cells may wear more quickly than the far memory cells.

Further, the various EDs may have different bit error rates. That is, for example, a longer length (e.g., a larger ED) may have a larger bit error than a shorter length (e.g., a smaller ED). In some cases, the memory array may be divided into regions (e.g., partitions) including a number of memory cells. Each memory cell in a region may have the same ED as other memory cells in that region. A codeword may include a number of accesses (e.g., a read or write) of the memory array. Thus, each codeword may access various regions of the memory array corresponding to different bit error rates (and EDs). A codeword that corresponds to memory cells that are relatively close together (e.g., within a single partition of the memory array) may result in each access for that codeword to have a similar bit error rate. That is, in certain conditions, the bit error rate for all accesses of the memory array may be high or the bit error rate for all accesses of the memory array may be low. Thus, the total and/or average bit error rate for the codeword may be high or low. Thus, the bit error rate with accesses with high bit error rates may be susceptible to a high bit error rate that is outside of specification for the memory array.

To mitigate potentially unacceptable bit error rates (and EDs) for a codeword and/or between codewords, one or more addresses of memory cells accessed for the codeword may be offset (e.g., remapped) to a different region of the memory array such that the bit error rates are more evenly distributed. In some embodiments, an address offset (e.g., remapping) may be applied to one or more accesses of the memory array 130 for a codeword. In other embodiments, the address offset may be applied to each access of the memory array 130 for the codeword. That is, a number of addresses for the codeword may be changed to smooth the bit error rates across the accesses of the memory array corresponding to the codeword. In this way, within a single codeword, some bit error rates may be high while others may be low, and still others may be at a medium level (e.g., between high and low). Smoothing the bit error rates may reduce an occurrence of each access of a codeword having a high bit error rate even if the bit error rate of some previously low bit error rate codewords may be elevated to a medium level.

As an example, when an access of the memory array has a high bit error rate (e.g., based on an ED of the accessed memory cell), embodiments provided herein may remap an address of subsequent memory cell to be accessed to a memory cell having a lower bit error rate. To do so, the remapped address may have a bit error rate below a threshold bit error rate for all accesses of the codeword.

In some embodiments, the remapped address may be a random address within the memory. In that case, however, the remapped address may not result in a lower bit error rate for the access of the corresponding memory cell. In some embodiments, a subset of memory cell addresses for the codeword may be remapped while other addresses are not changed. Thus, at least a portion of the bit error rates corresponding to a codeword may be changed. The remapped addresses may result in a reduced bit error rate for the codeword even though some of the remapped address may result in an increased bit error rate for a particular access of the memory array. In some cases, a remapped address may have a higher (or lower) bit error rate than the original address while the total bit error rate for a codeword may be reduced (or increased) due to remapping of other addresses for the codeword. That is, the bit error rate of one or more accesses of the memory array may be inversely related to a bit error rate of a corresponding codeword, so long as the total and/or average bit error rate for each codeword is within an acceptable range. In some embodiments, the remapping of the address may be made visible or invisible to a host device (e.g., a processor) that sends data to the memory device.

In some embodiments, an address scrambler may be used to remap one or more addresses of the memory array to be accessed for a codeword. To do so, the address scrambler may map memory cells of one region (e.g., partition) of the memory array to another suitable region. In some embodiments, the address scrambler may be visible or invisible to the host device (e.g., processor) that sends data to the memory device.

With the foregoing in mind, FIG. 1 is a block diagram of a portion of a memory device 100. The memory device 100 may be any suitable form of memory, such as non-volatile memory (e.g., a cross-point memory) and/or volatile memory. The memory device 100 may include one or more memory cells 102, one or more bitlines 104 (e.g., 104-0, 104-1, 104-2, 104-3), one or more wordlines 106 (e.g., 106-0, 106-1, 106-2, 106-3), one or more wordline decoders 108 (e.g., wordline decoding circuitry), and one or more bitline decoders 110 (e.g., bitline decoding circuitry). The memory cells 102, bitlines 104, wordlines 106, wordline decoders 108, and bitline decoders 110 may form a memory array 112.

Each of the memory cells 102 may include a selector and/or a storage element. When a voltage across a selector of a respective memory cell reaches a threshold, the storage element may be accessed to read a data value from and/or write a data value to the storage element. In some embodiments, each memory cell 102 may not include a separate selector and storage element, and may have a configuration such that the memory cell 102 nonetheless acts as having a selector and storage element (e.g., may include use of a material that behaves both like a selector material and a storage element material). For ease of discussion, FIG. 1 may be discussed in terms of bitlines 104, wordlines 106, wordline decoders 108, and bitline decoders 110, but these designations are non-limiting. The scope of the present disclosure should be understood to cover memory cells 102 that are coupled to multiple access lines and accessed through respective decoders, where an access line may be used to store data into a memory cell and read data from the memory cell 102.

The bitline decoders 110 may be organized in multiple groups of decoders. For example, the memory device 100 may include a first group of bitline decoders 114 (e.g., multiple bitline decoders 110) and/or a second group of bitline decoders 116 (e.g., different group of multiple bitline decoders 110). Similarly, the wordline decoders 108 may also be arranged into groups of wordline decoders 108, such as a first group of wordline decoders 118 and/or a second group of wordline decoders 120. Decoders may be used in combination with each other to drive the memory cells 102 (e.g., such as in pairs and/or pairs of pairs on either side of the wordlines 106 and/or bitlines 104) when selecting a target memory cell 102A from the memory cells 102. For example, bitline decoder 110-4 may operate in conjunction with bitline decoder 110'-4 and/or with wordline decoders 108-0, 108'-0 to select the memory cell 102A. As may be appreciated herein, decoder circuitry on either ends of the wordlines 106 and/or bitlines 104 may be different.

Each of the bitlines 104 and/or wordlines 106 may be metal traces disposed in the memory array 112, and formed from metal, such as copper, aluminum, silver, tungsten, or the like. Accordingly, the bitlines 104 and the wordlines 106 may have a uniform resistance per length and a uniform parasitic capacitance per length, such that a resulting parasitic load may uniformly increase per length. It is noted that the depicted components of the memory device 100 may include additional circuitry not particularly depicted and/or may be disposed in any suitable arrangement. For example, a subset of the wordline decoders 108 and/or bitline decoders 110 may be disposed on different sides of the memory array 112 and/or on a different physical side of any plane including the circuitries.

The memory device 100 may also include a control circuit 122. The control circuit 122 may communicatively couple to respective wordline decoders 108 and/or bitline decoders 110 to perform memory operations, such as by causing the decoding circuitry (e.g., a subset of the wordline decoders 108 and/or bitline decoders 110) to generate selection signals (e.g., selection voltage and/or selection currents) for selecting a target of the memory cells. In some embodiments, a positive voltage and a negative voltage may be provided on respective lines of one or more of the bitlines 104 and/or wordlines 106 to a target memory cell of the memory cells 102. In some embodiments, the decoder circuits may provide electrical pulses (e.g., voltage and/or current) to the access lines to access the memory cell. The electrical pulse may be a square pulse, or in other embodiments, other shaped pulses may be used. In some embodiments, a voltage provided to the access lines may be a constant voltage.

Activating the decoder circuits may enable the delivery of an electrical pulse to the target memory cell of the memory cells 102 such that the control circuit 122 is able to access data storage of the target memory cell, such as to read from or write the data storage. After a target memory cell of the memory cells 102 is accessed, data stored within storage medium of the target memory cell may be read or written.

Writing to the target memory cell may include changing the data value stored by the target memory cell. As previously discussed, the data value stored by a memory cell may be based on a threshold voltage of the memory cell. In some embodiments, a memory cell may be "set" to have a first threshold voltage, or may be "reset" to have a second threshold voltage. A set memory cell may have a lower threshold voltage than a reset memory cell. By setting or resetting a memory cell, different data values may be stored by the memory cell. Reading a target of the memory cells 102 may include determining whether the target memory cell was characterized by the first threshold voltage and/or by the second threshold voltage. In this way, a threshold voltage window may be analyzed to determine a value stored by the target of the memory cells 102. The threshold voltage window may be created by applying programming pulses with opposite polarity to the memory cells 102 (e.g., in particular, writing to selector device (SD) material of the memory cell) and reading the memory cells 102 (e.g., in particular, reading a voltage stored by the SD material of the memory cell) using a signal with a given (e.g., known) fixed polarity.

The memory device 100 may include an address scrambler 124 communicatively coupled to the control circuit 122. The address scrambler 124 may adjust or offset one or more addresses to other suitable addresses based on a selection input (e.g., a memory address). As an example, the address scrambler 124 may map a region (e.g., partition) of a memory address to another suitable region of the memory array 112. The address scrambler 124 may be implemented in hardware, software, firmware, or a combination thereof. The address scrambler 124 may be programmed such that each bit error rate for accessed memory cells corresponding to a codeword are averaged across all accesses for that codeword. In doing so, the address scrambler 124 may change (e.g., reduce or increase) a total (and average) bit error rate for the codeword. For example, the address scrambler 124 may increase a bit error rate for one codeword from low to medium levels while reducing a bit error rate for another codeword from high to medium levels. Thus, the address scrambler 124 may smooth (e.g., distribute) the total bit error rate across multiple codewords to ensure that each codeword transmission remains within specification for the memory array 112.

Figure 2:
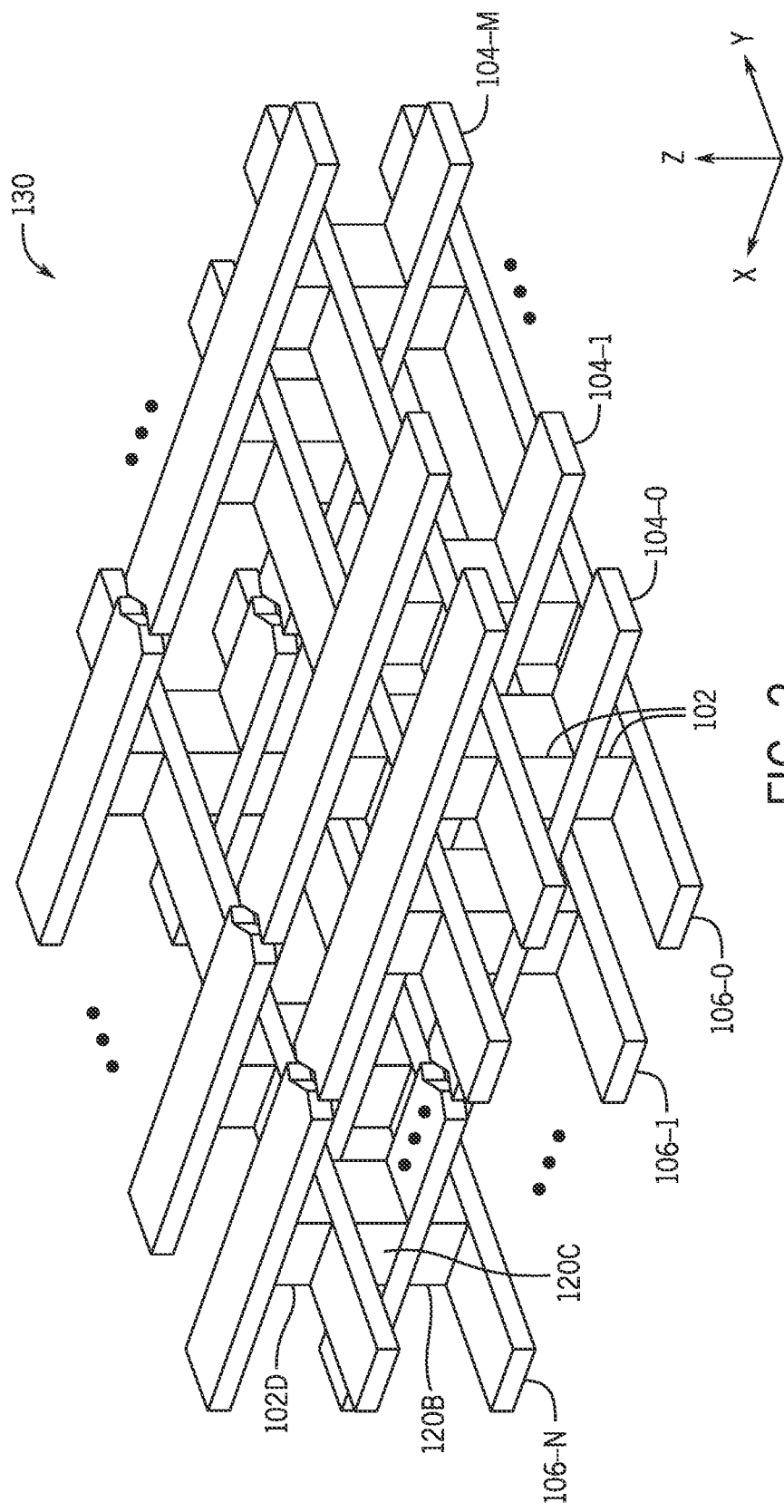
FIG. 2 is a side-view of a diagram illustrating the portion of the memory array of FIG. 2, according to an embodiment of the present disclosure.

FIG. 2 is a diagram illustrating a portion of a memory array 130 in accordance with an embodiment of the present disclosure. The memory array 130 may be a cross-point array including wordlines 106 (e.g., 106-0, 106-1, . . . , 106-N) and bitlines 104 (e.g., 104-0, 104-1, . . . , 104-M). A memory cell 102 may be located at each of the intersections of the wordlines 106 and bitlines 104. The memory cells 102 may function in a two-terminal architecture (e.g., with a particular of the wordlines 106 and the bitlines 104 serving as the electrodes for a particular of the memory cells 102). In some embodiments, the memory array 130 may correspond to the memory array 112 discussed with respect to FIG. 1.

Each of the memory cells 102 may be resistance variable memory cells, such as resistive random-access memory (RRAM) cells, conductive-bridging random access memory (CBRAM) cells, phase-change memory (PCM) cells, and/or spin-transfer torque magnetic random-access memory (STT-RAM) cells, among other types of memory cells. Each of the memory cells 102 may include a memory element (e.g., memory material) and a selector element (e.g., a selector device (SD) material) and/or a material layer that functionally replaces a separate memory element layer and selector element layer. The selector element (e.g., SD material) may be disposed between a wordline contact (e.g., a layer interface between a respective one of the wordlines 106 and the memory material) and a bitline contact (e.g., a layer interface between a respective one of the bitlines 104 and the selector element) associated with a wordline or bitline forming the memory cell. Electrical signals may transmit between the wordline contact and the bitline contact when reading or writing operations are performed to the memory cell.

The selector element may be a diode, a non-ohmic device (NOD), or a chalcogenide switching device, among others, or formed similar to the underlying cell structure. The selector element may include, in some examples, selector material, a first electrode material, and a second electrode material. The memory element of memory cell 102 may include a memory portion of the memory cell 102 (e.g., the portion programmable to different states). For instance, in resistance variable memory cells 102, a memory element can include the portion of the memory cell having a resistance that is programmable to particular levels corresponding to particular states responsive to applied programming voltage and/or current pulses. In some embodiments, the memory cells 102 may be characterized as threshold-type memory cells that are selected (e.g., activated) based on a voltage and/or current crossing a threshold associated with the selector element and/or the memory element. Embodiments are not limited to a particular resistance variable material or materials associated with the memory elements of the memory cells 102. For example, the resistance variable material may be a chalcogenide formed of various doped or undoped chalcogenide-based materials. Other examples of resistance variable materials that may be used to form storage elements include binary metal oxide materials, colossal magnetoresistive materials, and/or various polymer-based resistance variable materials, among others.

In operation, the memory cells 102 may be programmed by applying a voltage (e.g., a write voltage) across the memory cells 102 via selected wordlines 106 and bitlines 104. A sensing (e.g., read) operation may be performed to determine a state of one or more memory cells 102 by sensing current. For example, the current may be sensed on one or more bitlines 104 corresponding to the respective memory cells 102 in response to a particular voltage applied to the selected of the wordlines 106 forming the respective memory cells 102.

As illustrated, the memory array 130 may be arranged in a cross-point memory array architecture (e.g., a three-dimensional (3D) cross-point memory array architecture) that extends in any direction (e.g., x-axis, y-axis, z-axis). The multi-deck cross-point memory array 130 may include a number of successive memory cells (e.g., 102B, 102C, 102D) disposed between alternating (e.g., interleaved) decks of wordlines 106 and bitlines 104. The number of decks may be expanded in number or may be reduced in number and should not be limited to the depicted volume or arrangement. Each of the memory cells 102 may be formed between wordlines 106 and bitlines 104 (e.g., between two access lines), such that a respective one of the memory cells 102 may be directly electrically coupled with (e.g., electrically coupled in series) with its respective pair of the bitlines 104 and wordlines 106 and/or formed from electrodes (e.g., contacts) made by a respective portion of metal of a respective pair of bitlines 104 and wordlines 106. For example, the memory array 130 may include a three-dimensional matrix of individually-addressable (e.g., randomly accessible) memory cells 102 that may be accessed for data operations (e.g., sense and write) at a granularity as small as a single storage element and/or multiple storage elements. In some cases, the memory array 130 may include more or less bitlines 104, wordlines 106, and/or memory cells 102 than shown in the examples of FIG. 2. Each deck may include one or more memory cells 102 aligned in a same plane.

Figure 3:
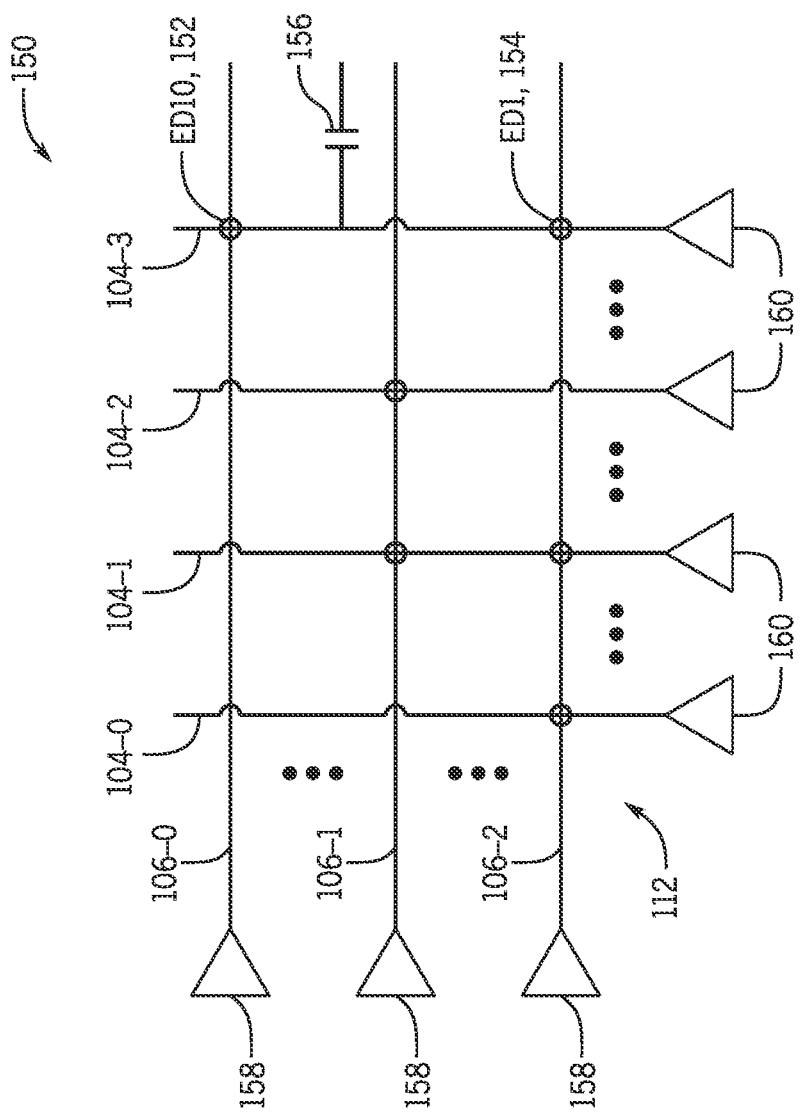
FIG. 3 is a simplified circuit diagram of the memory array of FIG. 1, according to an embodiment of the present disclosure.

FIG. 3 is a simplified diagram of a deck of a memory device 150 that may be an embodiment of the memory device 100. As previously discussed, at the intersections of the bitlines 104 and the wordlines 106 in the memory array 112, the memory cells 102 may be used to store information. However, the memory cells 102 have been omitted from FIG. 3 for simplicity. As illustrated, each bitline 104 is driven by a respective bitline driver 160 and each wordline is driven by a respective wordline driver 158. For instance, the bitline drivers 160 may include bitline decoders 110 discussed with respect to FIG. 1 and/or may drive the bitlines 104 based on values decoded by the bitline decoders 110. Similarly, the wordline drivers 158 may include the wordline decoders 108 discussed with respect to FIG. 1 and/or may drive the wordlines 106 based on values decoded by the wordline decoders 108.

A selected bitline 104-3 may be used to read and/or write data at intersections 152 and 154. A local driver 160 may supply a signal to the intersections 152 and 154 via the selected bitline 104-3. The local driver 160 may be used to gate a voltage to the intersections 152 and 154. The local driver 160 may perform gating using a control signal driven by the control circuit 122. The voltage provided to the intersections 152 and 154 may be provided using current supplied via a current mirror from a current supply.

As may be appreciated, the memory array 112 may include parasitic capacitance represented by a capacitor 156. Based at least in part on the parasitic capacitance and/or resistance in the memory array 112, different intersections have a different electrical distance (ED) that causes different voltages to be seen at different memory cells 102. In other words, a voltage seen at the intersection 152 may differ from a voltage seen at the intersection 154 when the respective wordlines 106 and bitlines 104 are driven to the same value. In particular, the intersection 154 may have less resistance (and parasitic capacitance) between the intersection 154 and the corresponding bitline driver 160 than the intersection 152 has between the intersection 152 and the corresponding bitline driver 160. As previously noted, an electrical distance (ED) of a particular intersection may correspond to a physical distance of the particular intersection from the corresponding wordline driver 158 and/or the corresponding bitline driver 160.

Figure 4:
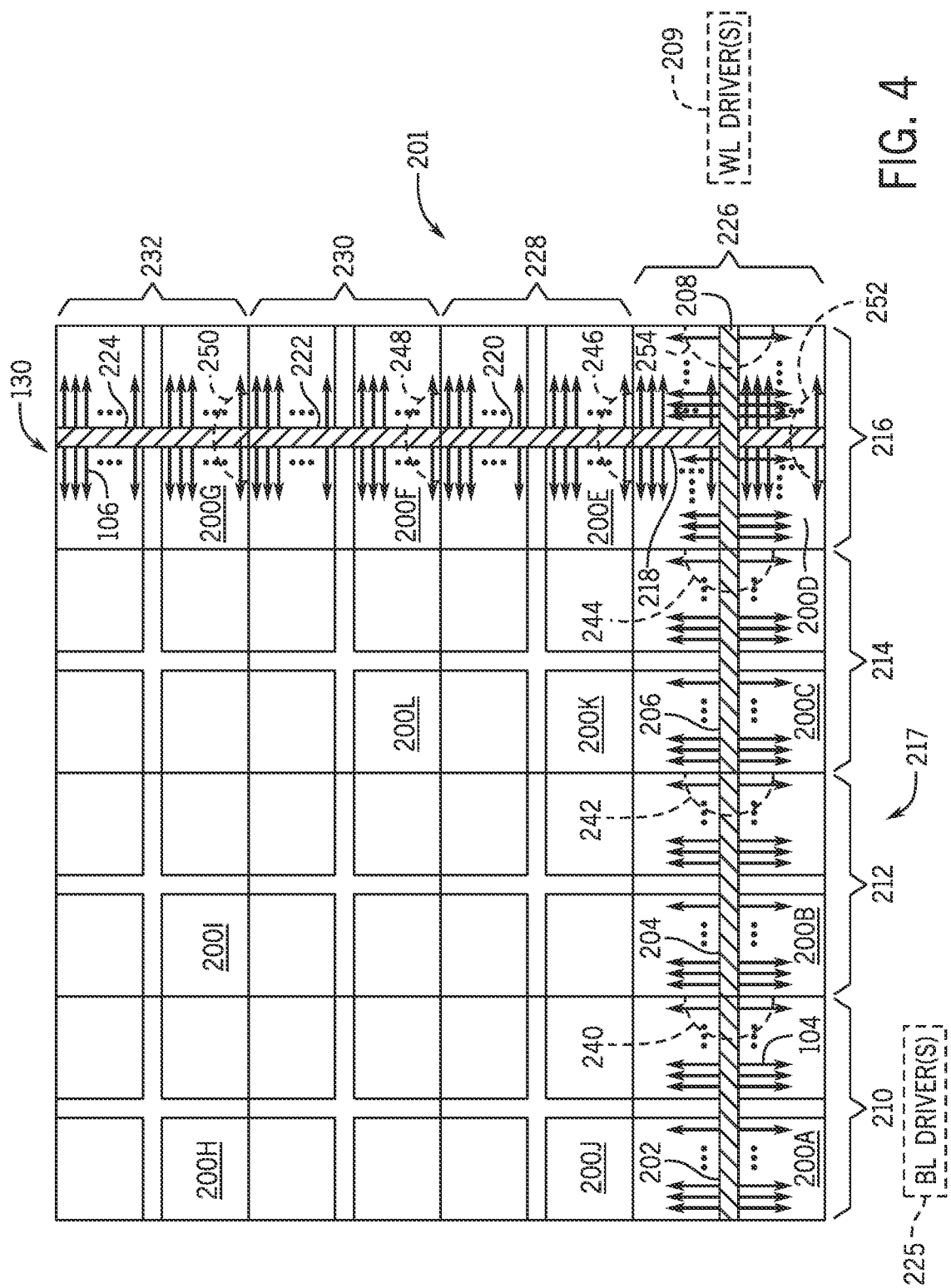
FIG. 4 is a diagram of the regions of memory cells in the memory array of FIG. 1 with wordlines and bitlines in an arrangement being driven in rows and columns in the memory array, according to an embodiment of the present disclosure.

FIG. 4 is a diagram of the regions of memory cells 102 in the memory array 130 of FIG. 1 with wordlines and bitlines in an arrangement being driven in rows and columns in the memory array, according to an embodiment of the present disclosure. The memory cells 102 are located into regions 200 (e.g., 200A-200L, etc.). The regions 200 may have wordlines 106 that are driven from a first side 201 of the memory array 130. The driving of the wordlines 106 may be made via local drivers 202, 204, 206, and 208 for columns 210, 212, 214, and 216. The local drivers 202, 204, 206, and 208 may be driven by one or more edge-located WL drivers 209.

Similar to the wordlines 106, the regions 200 may have bitlines 104 that are driven from a second side 217 of the memory array 130. The driving of the bitlines 104 may be made via local drivers 218, 220, 222, and 224 for rows 226, 228, 230, and 232. The local drivers 218, 220, 222, and 224 may be driven by one or more edge-located BL drivers 225.

Within the regions 200, sub-groups of memory cells 102 may have common EDs that indicate that the memory cells 102 are susceptible to a similar rush current magnitude. Memory cells 102 located at intersections may be designated as part of sub-groups 240, 242, 244, 246, 248, and 250. For instance, the memory cells 102 in the sub-groups 240, 242, 244, 246, 248, and 250 may have greater EDs based on physical distances to the corresponding WL drivers 209 and the BL drivers 225 via respective local drivers 202, 204, 206, 220, 222, and 224. The physical distance may be relative within each group for the respective local drivers 202, 204, 206, 220, 222, and 224.

In some cases, the bit error rate may incrementally decrease at the memory cells 102 moving across the respective local drivers 202, 204, 206, 220, 222, and 224 away from the respective first side 201 and second side 217. For instance, the region 200A may include a sub-group 240 that may have a bit error rate (and ED) larger than that of the region 200D. In some embodiments, at least one entire region (e.g., region 200D) may be completely remapped to one or more other regions 200. In some cases, the bit error rate corresponding to an access of the memory cells 102 may be non-linear with respect to a distance from the respective local drivers 202, 204, 206, 220, 222, and 224. For example, the bit error rate of the region 200L may be less than a bit error rate of the regions 200G and 200H. For instance, as the memory device 100 ages, the close regions 200D may have a higher error rate than far regions (e.g., region 200G) that has a higher error rate than middle regions (e.g., region 200F). In such cases, the far and close regions may have high bit error rates relative to the middle regions.

When the address scrambler 124 remaps the one or more memory cells 102 to redistribute bit error rates for a codeword, the address scrambler 124 may receive a memory address and may compute the new mapped addresses dynamically as commands are received and decoded. The mapped addresses may be sent to the memory array 130. This remapping may be performed in real time without greatly impacting the throughput requirements of the memory device 100. This remapping scheme may also be relatively easily applied for multiple decks to the memory device 100 each remapped independently and/or remapped across multiple decks.

When remapping, a memory cell 102 may be remapped to a region (e.g., 200H and 200I) that that has a different bit error rate (and ED) than the region from which the memory cell 102 is being remapped. Indeed, memory cells 102 in the further regions (e.g., 200H or 200I) may have an ED larger than memory cells 102 in the closer regions (e.g., 200K and 200F). Thus, a bit error rate of a codeword accessing memory cells 102 in the further regions and the closer regions may be larger than if the codeword accessed only closer memory cells 102. However, the bit error rate of a particular region (and corresponding memory cells) may change as the memory array 130 ages. For example, regions farther from the respective drivers 202, 204, 206, 220, 222, and 224 may have a larger bit error rate than regions closer to the respective drivers at the beginning of life of the memory array 130 due to a difference in ED but a smaller bit error rate than the farther regions as the memory array 130 ages due to wear and/or breakdown of the electrical properties of the memory device.

A worst-case bit error rate may occur when all accesses of a particular codeword are to memory cells 102 within a single region (e.g., 200k). In that case, the bit error rate for each access to the memory cell 102 may be substantially the same and thus may contribute to a larger bit error rate of the codeword. On the other hand, if the codeword includes an access to both a memory cell 102 in a region with a larger bit error rate (e.g., 200H) and a memory cell in a region with a smaller bit error rate (e.g., 200D), the bit error rate from accessing the region with the smaller bit error rate may offset the bit error rate from accessing the region with the larger bit error rate. Thus, by offsetting and/or scrambling the regions 200 to be accessed for a particular codeword, the bit error rate for that codeword may be reduced for worst case scenarios. Similarly, offsetting and/or scrambling the regions 200 for another codeword may be used to remap from regions with a low bit error rate to regions with low and/or high bit error rates to cause the total and/or average bit error rate of the codeword to increase but remain within an acceptable range.

A worst case latency for accessing regions 200 for a particular codeword may occur when some accesses for a particular codeword have a relatively large latency and other accesses have a relatively small latency. To reduce a latency for a particular codeword, offsetting and/or scrambling the regions 200 to be accessed may be based at least in part on a latency to access each region 200 corresponding to the codeword. For example, to reduce a latency for a codeword, the address scrambler 124 may group the remapped addresses within a single region 200, regardless of an ED from the corresponding wordline and bitline drivers 158, 160. In some cases, the address scrambler 124 may group the remapped addresses within a relatively small number of regions 200 having similar EDs from the corresponding wordline and bitline drivers 158, 160. The address scrambler 124 may balance a latency and a bit error rate of accessing the memory array 130. In this way, the address scrambler 124 may enable a variable latency corresponding to a codeword that can be reduced (or increased) based on the remapping.

The sub-groups 240, 242, 244, 246, 248, and 250, and any other sub-groups, may have any suitable shape to encompass the memory cells 102 having a similar bit error rate (and ED). For instance, the sub-groups 240, 242, 244, 246, 248, and 250, and other sub-groups, may be shaped in a semi-circular shape, a triangular shape, a rectangular shape, an irregular shape, or any other suitable shape. Furthermore, the sub-groups 240, 242, 244, 246, 248, and 250 may have a single general shape or may have different shapes based on the different EDs and/or bit error rates. Furthermore, the sub-groups 240, 242, 244, 246, 248, and 250 may have a uniform size for each region 200, or the sub-groups 240, 242, 244, 246, 248, and 250 may have different sizes. For instance, the sub-groups 240, 242, 244, 246, 248, and 250 closer to the first side 201 and/or the second side 217 may have larger sizes while those further from the sub-groups 240, 242, 244, 246, 248, and 250 may have smaller sizes.

Figure 5:
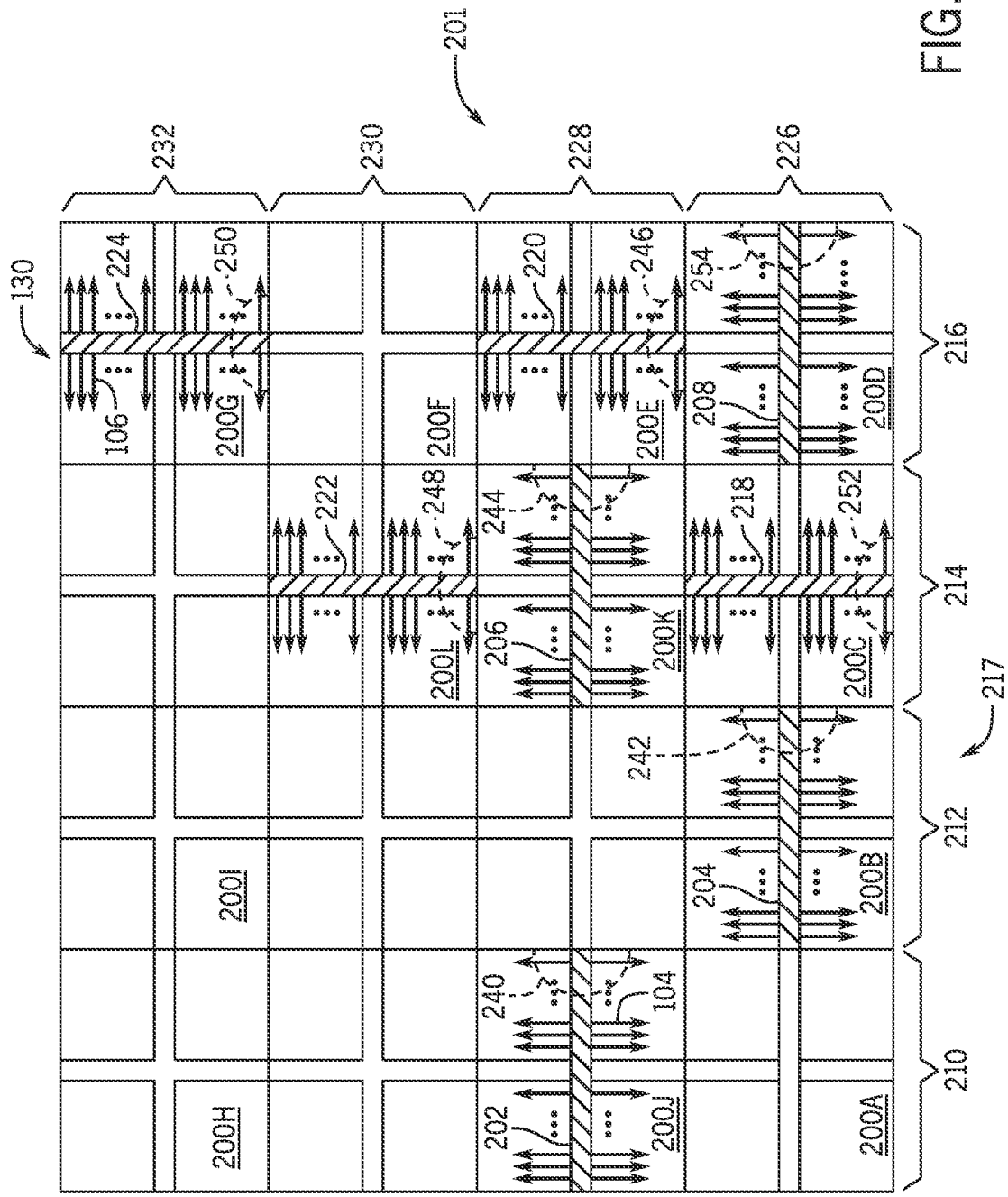
FIG. 5 is a diagram of the regions of memory cells in the memory array of FIG. 1 with wordlines and bitlines in an arrangement being driven in rows and columns in the memory array, according to an embodiment of the present disclosure.

The memory array 130 may have different arrangements than the one shown in FIG. 4. For instance, FIG. 5 illustrates an alternative arrangement of the memory array 130 with no more than a single local driver in a region 200 to interleave the local drivers 202, 204, 206, 208, 218, 220, 222, and 224. As illustrated in FIG. 5, the local drivers 202, 206, 218, and 222 (along with the related sub-groups 240, 244, and 218) have been relocated to respective regions 200J, 200K, 200C, and 200L. That is, the local drivers 202, 204, 206, 208, 218, 220, 222, and 224 are disposed on alternating rows 226, 228, 230, and 232 and columns 210, 212, 214, and 216. Additionally, the local drivers 208 and 218 may be separated from each other each having its own sub-groups 252 and 254. Although the arrangement in FIG. 5 may be different than FIG. 4, the address scrambler 124 may remap from the sub-groups 240, 242, 244, 246, 248, 250, 252, and 254 using any of techniques previously discussed. Indeed, the memory array 130 may be driven in any other suitable arrangement, and the address scrambler 124 may remap memory cells 102 for one or more codewords such that the bit error rate for each access and/or for the codeword is below a threshold value, regardless of arrangement.

Figure 6:
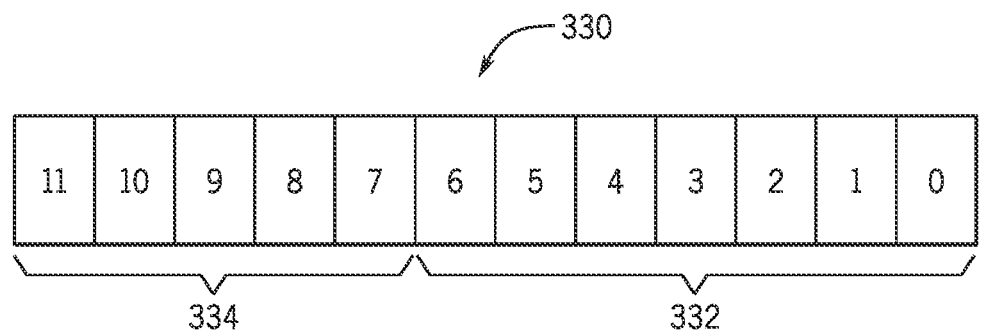
FIG. 6 is an example address of a particular memory cell of the memory array of FIG. 1, according to an embodiment of the present disclosure.

FIG. 6 is an example address 330 of a particular memory cell 102 of the memory array of FIG. 1, according to an embodiment of the present disclosure. As shown, the address 330 includes 12 bits, numbered 0-11. It should be understood that the address 330 may include any number of bits. The address 330 may correspond to a particular memory cell of the memory array 112 to be accessed for a codeword. That is, a codeword may correspond to a number of addresses 330 each having a similar number of bits.

The address 330 may include a first portion 332 including bits 0-6 corresponding to an mth memory cell 102 of the memory array 112 in a first direction (e.g., X or Y) and a second portion 334, including bits 7-11, corresponding to an nth memory cell 102 of the memory array 112 in a second direction (e.g., X or Y). It should be understood that the address 330 may include any number of bits corresponding to an address of a memory cell 102 in the memory array 112. Further, one or more bits of the address 330 may specify a region 200 (e.g., partition) in which the corresponding memory cell 112 is located.

To distribute a bit error rate for the accesses of a codeword, at least a portion (e.g., one or more bits) of the address 330 may be offset or remapped. In some embodiments, the offset may be determined and applied by the address scrambler 124 discussed with respect to FIG. 1. That is, the address scrambler 124 may remap the address 330 to a memory cell 102 and/or region 200 having a different bit error rate than the original memory address 330.

Figure 7:
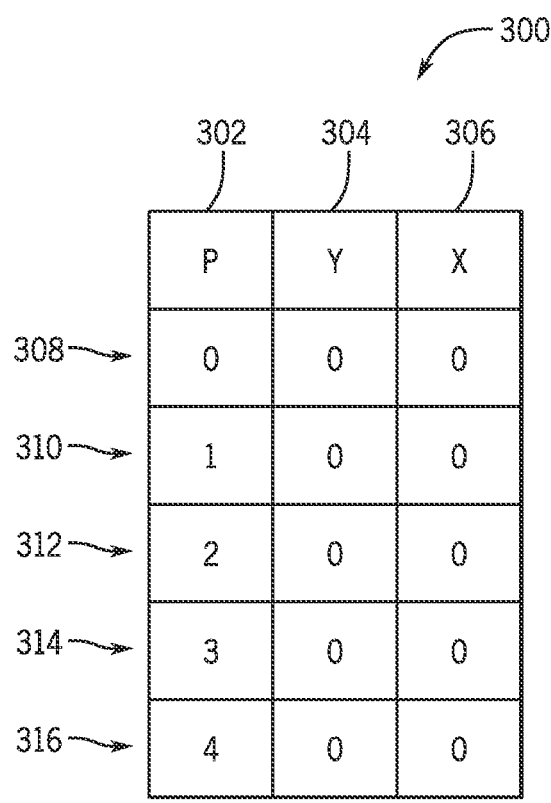
FIG. 7 is an example table of addresses for memory cells of the memory array of FIG. 1 including a partition address, according to an embodiment of the present disclosure.

As an example, the first portion 332 may be unchanged and the second portion 334 may be remapped when accessing the memory array 112. The remapping of the second portion 334 may be based on a region 200 of the address 330. For example, a number of addresses are illustrated in a table 300 of FIG. 7. Each row 308-316 of the table 300 corresponds to an address in the memory array 112, 130, such as the address 330 of FIG. 6. As illustrated, each address 308-316 (e.g., row) includes a partition 302, a Y coordinate 304, and an X coordinate 306. The X and Y coordinates 306, 304 may correspond to wordlines and/or bitlines associated with the respective memory cell 102 of the memory array 112. The partition 302 of each address corresponds to a region 200 of the memory array 130, discussed with respect to FIG. 4. That is, the partition 302 for a first address 308 may correspond to the region 200D of FIG. 4. In some embodiments, the X and Y coordinates 306 and 304 may correspond to a physical location within the corresponding partition 302.

To distribute the bit error rates of the accesses for a codeword such that each bit error rate for the codeword is close to an average (e.g., within a threshold) of the bit error rates for the codeword, the second portion 334 of the address 330 may be offset based on the corresponding partition 302. For example, the partition 302 may be changed to a different value for some addresses 330.

In some cases, the X and Y coordinates 306, 304 may be modified based on the corresponding partition 302. In some embodiments, the X and Y coordinates 306, 304 for the first row 308 may not be modified because the value of the corresponding partition 302 is zero. In that case, the offset may be based on a product (e.g., multiplication) of the X and/or Y coordinate 304, 306 and the corresponding partition. In some embodiments, the X and Y coordinates 304, 306 may be modified by adding or subtracting the X and/or Y coordinate 304, 306 and the corresponding partition. In some embodiments, a value of one coordinate (e.g., the X or Y coordinate 304, 306) may be adjusted based on the other coordinate (e.g., the X or Y coordinate 304, 306). That is, one coordinate (e.g., the X or Y coordinate 304, 306) may be used as an offset for the other coordinate (e.g., the X or Y coordinate 304, 306).

The X and Y coordinates 306, 304 for the second row 310 may be modified based on the partition 302 (e.g., 1) of the second row 310. In some embodiments, the address 330 of the second row 310 may be converted to hexadecimal and used to offset the X and Y coordinates 306, 304. That is, the partition, X, and/or Y coordinates 306, 304 corresponding to the second row 310 may be offset by a number (e.g., decimal 80, binary 000001010000, or hexadecimal 50, etc.). Similarly, the partition, X, and/or Y coordinates 306, 304 of the third row 312 may be offset by 100 hexadecimal or 000100000000 in 12-bit binary). In some embodiments, the X and/or Y coordinates 306, 304 may be modified based on a value of the partition 302. In this way, the address 330 used to access the target memory cell 102 of the memory array 112 may be remapped such that the corresponding region 200, and thus the bit error rate for each access, may be changed. At least a portion of the addresses of memory cells 102 to be accessed for a codeword may be remapped in this way.

Figure 8:
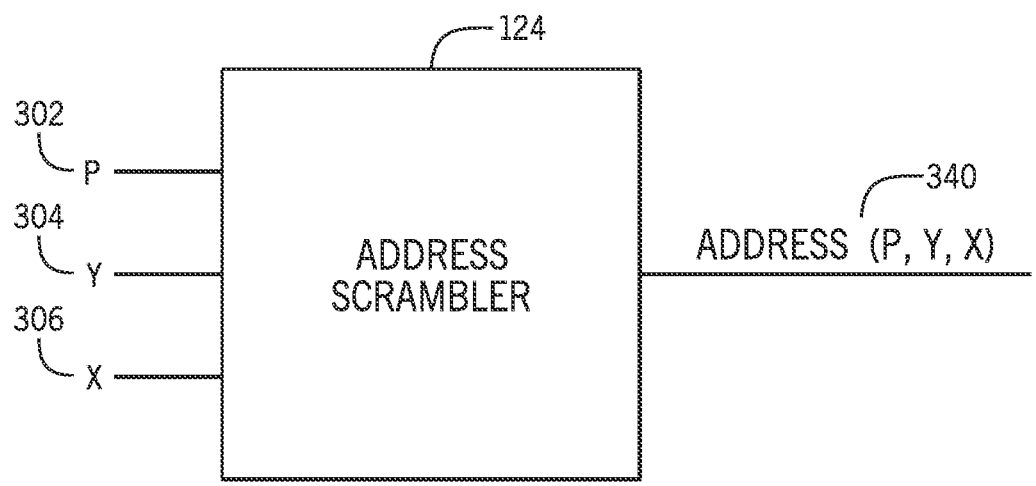
FIG. 8 is a block diagram of an address scrambler, according to an embodiment of the present disclosure.

FIG. 8 is a block diagram of an address scrambler 124, according to an embodiment of the present disclosure. The address scrambler 124 may be used in addition to or alternative to the address offset discussed with respect to FIGS. 6 and 7. As illustrated, the address scrambler 124 may receive an address of a memory cell 102 including the partition 302, the Y coordinate 304, and the X coordinate 306, discussed with respect to FIGS. 6 and 7. The address scrambler 124 may output an address 340 to be used to access (e.g., read or write) a memory cell 102 of the memory array 112. The address 340 output by the address scrambler 124 may be different than the address received by the address scrambler 124. For example, the address scrambler 124 may adjust or change one or more of the partition 302, the Y coordinate 304, and the X coordinate 306 of the received address.

As discussed above, the address scrambler 124 may be implemented in hardware, software, firmware, or a combination thereof. For example, the address scrambler 124 may be programmable using lookup tables or remapping circuitry that uses an input region 200 to a different output region 200. The address scrambler 124 may be programmed such that the bit error rates of the target memory cells corresponding to a codeword are averaged across all accesses for that codeword. In doing so, the address scrambler 124 may reduce and/or increase a bit error rate for all accesses for the codeword, while the total and/or average bit error rate for the codeword remains within an acceptable range.

Figure 9:
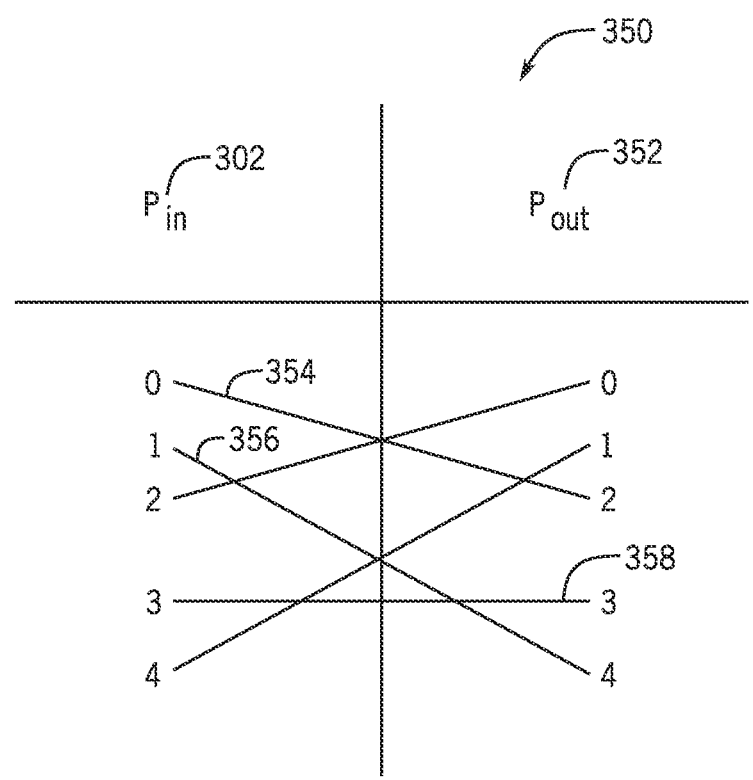
FIG. 9 is an example address mapping of the address scrambler of FIG. 8, according to an embodiment of the present disclosure.

FIG. 9 is an example address mapping 350 performed in the address scrambler of FIG. 8, according to an embodiment of the present disclosure. The address mapping 350 illustrates an example mapping from the received partition 302 (e.g., an input partition) to an output partition 352 of the output address 340. As shown, the address mapping 350 may change a received partition 302 of zero to a second partition as indicated by a first line 354. Similarly, the address mapping 350 may remap a received partition 302 from a first partition to a fourth partition as indicated by a line 356. In some cases, the address mapping 350 may not change an input partition 302 to a different partition. That is, one or more output partitions 352 may be the same as the corresponding input partitions 302. For example, the address mapping 350 maintains the third partition from the input partition 302 to the output partition 352 as indicated by a line 358. It should be understood that additional or alternative mappings different from the example address mapping 350 are possible.

In some embodiments, the address mapping 350 may be set such that the one or more bit error rates corresponding to accesses of the memory array 112 for a codeword is changed (e.g., increased and/or decreased), so long as the bit error rate for the codeword is within an acceptable range. In some embodiments, the mapping may be a random mapping such that each input partition 302 maps to a different output partition 352 and such that at least some of the EDs corresponding to accesses of the memory array 112 for a codeword is similar to an average ED for all accesses for that codeword.

The mapping performed by the address scrambler 124 may vary for some addresses received at the address scrambler 124. For example, the address scrambler 123 may use a different mapping for a received address 302, 304, 306 as long as the bit error rate for each access of the memory array 112 and/or the bit error rate of the codeword is within an acceptable range. In some embodiments, the mapping of the address scrambler may vary between received addresses (e.g., received addresses 302, 304, and 306). Furthermore, the remapping in the address scrambler 124 may change over time due to wear and/or breakdown of the electrical properties of the memory device.

Advantageously, the embodiments presented herein provide techniques for adjusting (e.g., reducing or increasing) a bit error rate of accessing a memory array without unduly delaying access to a particular region of the memory device. To do so, embodiments herein may distribute the regions of the memory array accessed by received memory addresses based on a bit error rate of the region corresponding to the received memory address and a bit error rate of the region of the remapped memory address. The regions may be distributed horizontally and/or vertically across the memory array, such that a total and/or average bit error rate of the accessed memory locations for a codeword is within an acceptable range. In this way, the techniques presented herein may distribute the accesses of the memory array to smooth a bit error rate for a codeword and/or across multiple codewords.

Technical effects of the present disclosure include systems and methods that enable a distribution of memory cells accessed based on a selection input to compensate for differences in bit error rates at the corresponding locations within the memory array. By distributing the accessed memory cells, the memory device may perform more consistently and may reduce a dispersion of bit error rates across accesses of the memory array resulting in improved efficiency and accuracy of the memory device.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
a plurality of access lines arranged in a grid;
a plurality of memory cells located at intersections of the plurality of access lines in the grid;
a plurality of drivers, each configured to transmit a corresponding signal to respective memory cells of the plurality of memory cells;
a plurality of regions, wherein each respective region comprises memory cells having a same electrical distance;
a first region of the plurality of regions comprising a first memory cell with a first electrical distance and a second region of the plurality of regions comprising a second memory cell with a second electrical distance;
a plurality of codewords, wherein each of the plurality of codewords is configured to access at least one of the plurality of regions; and
an address scrambler configured to remap an address of the first memory cell to the second memory cell based at least in part on a relationship of a bit error rate for accessing the first memory cell and a threshold bit error rate.

2. The device of claim 1, wherein the plurality of access lines comprises bitlines and wordlines.

3. The device of claim 1, wherein the bit error rate of each of the plurality of memory cells is based at least in part on an electrical distance of the memory cell to one or more drivers of the plurality of drivers.

4. The device of claim 1, wherein the bit error rate is based at least in part on an age of the plurality of memory cells.

5. The device of claim 1, wherein a bit error rate for the codeword configured to access the second region is below the threshold bit error rate.

6. The device of claim 1, wherein the threshold bit error rate is based at least in part on a specification for the memory device.

7. The device of claim 1, wherein the address scrambler is configured to reduce the average bit error rate for one of the plurality of codewords by scrambling addresses of at least one of the plurality of memory cells associated with the one of the plurality of codewords.

8. The device of claim 1, comprising a control circuit coupled to the plurality of memory cells via the plurality of access lines, wherein the threshold bit error rate is based at least in part on an average bit error rate for accessing the memory cells associated with a respective codeword according to a selection input received by the control circuit.

9. A method, comprising:
receiving, at an address scrambler, an indication of a memory cell of a plurality of memory cells of a memory device, wherein
the plurality of memory cells is distributed in a plurality of regions within a memory array;

the plurality of memory cells are distributed at a plurality of intersections of wordlines and bitlines of the memory device and are distributed within the plurality of regions, wherein each region comprises memory cells with a same electrical distance; and the memory cell is indicated as to-be-accessed and is located within one of the plurality of regions at a particular intersection of the wordlines and the bitlines; and remapping, using the address scrambler, the memory cell to a different memory cell in a different region with a different electrical distance from the memory cell based on an estimated bit error rate for accessing the different memory, the estimated bit error rate based at least in part on an electrical distance of the different memory cell from a corresponding driver.

10. The method of claim 9, wherein the estimated bit error rate for accessing the different memory cell is within a threshold of one or more bit error rates for accessing a number of memory cells of the plurality of memory cells.

11. The method of claim 9, comprising:
determining, using the address scrambler, one or more bit error rates corresponding to a number of memory cells of the plurality of memory cells.

12. The method of claim 9, wherein the indication of the memory cell and the number of memory cells are associated with a codeword to be accessed via the memory.

13. The method of claim 12, wherein the codeword is configured to access at least one of the plurality of memory cells within at least one of the plurality of regions of the memory array.

14. A memory device, comprising:
a plurality of bitlines arranged in parallel;
a plurality of wordlines arranged in parallel and perpendicular to the plurality of bitlines;
a plurality of memory cells located at intersections of the plurality of bitlines and the plurality of wordlines,
a plurality of drivers, each configured to transmit a corresponding signal to respective memory cells of the plurality of memory cells, wherein each memory cell of the plurality of memory cells has an electrical distance; and
a plurality of regions, wherein each respective region comprises memory cells having a same electrical distance;
an address scrambler configured to:
receive an address of a memory cell of the plurality of memory cells within a first of the plurality of regions with a first electrical distance; and
remap the address to a different memory cell of the plurality of memory cells within a second of the plurality of regions with a second electrical distance based at least in part on an electrical distance of the memory cell from one or more of the plurality of drivers.

15. The memory device of claim 14, wherein the address of the memory cell of the plurality of memory cells corresponds to a region of the plurality of regions, a bitline of the plurality of bitlines, and a wordline of the plurality of wordlines and wherein the address is remapped by changing at least one of the region, the bitline, and the wordline.

16. The memory device of claim 14, wherein the address is remapped to the different memory cell upon determining that a bit error rate corresponding to the address does not satisfy a threshold bit error rate of a codeword for accessing the memory cell.

17. The device of claim 1, wherein the address scrambler is configured to distribute average bit error rates of the plurality of codewords by scrambling addresses of the memory cells associated with each of the plurality of codewords.

18. The device of claim 1, wherein a bit error rate for the codeword configured to access the first region is below the threshold bit rate error and a bit rate error for the codeword configured to access the second region is above the threshold bit rate error.

19. The device of claim 1, wherein the address scrambler is configured to remap the address of the first memory cell to the second memory cell based at least in part on a latency of one of the plurality of codewords.

20. The method of claim 12, wherein the memory cell and the different memory cell are accessed by different codewords.

* * * * *